US008883374B2

(12) United States Patent
Altamirano Sanchez

(10) Patent No.: US 8,883,374 B2
(45) Date of Patent: Nov. 11, 2014

(54) EUV PHOTORESIST ENCAPSULATION

(71) Applicant: IMEC, Leuven (BE)

(72) Inventor: Efrain Altamirano Sanchez, Kessel-lo (BE)

(73) Assignee: IMEC, Leuven (BE)

( * ) Notice: Subject to any disclaimer, the term of this patent is extended or adjusted under 35 U.S.C. 154(b) by 63 days.

(21) Appl. No.: 13/705,418

(22) Filed: Dec. 5, 2012

(65) Prior Publication Data
US 2013/0164657 A1   Jun. 27, 2013

(30) Foreign Application Priority Data

Dec. 21, 2011  (EP) .................................... 11194789
Jan. 10, 2012  (EP) .................................... 12150658

(51) Int. Cl.
*G03F 1/20* (2012.01)
*H01L 21/027* (2006.01)
*H01L 21/308* (2006.01)

(52) U.S. Cl.
CPC .............. *G03F 1/20* (2013.01); *H01L 21/0273* (2013.01); *H01L 21/3081* (2013.01)
USPC .............................................. 430/5; 430/323

(58) Field of Classification Search
USPC ....................... 430/5, 311, 313, 322, 323, 394
See application file for complete search history.

(56) References Cited

U.S. PATENT DOCUMENTS

| 3,962,004 | A | 6/1976 | Sonneborn |
| 2002/0142607 | A1 | 10/2002 | Gabriel et al. |
| 2004/0023497 | A1 | 2/2004 | Pan et al. |
| 2005/0118531 | A1 | 6/2005 | Lee et al. |
| 2007/0037410 | A1 | 2/2007 | Chang et al. |
| 2009/0104566 | A1 | 4/2009 | Burkhardt et al. |
| 2009/0163035 | A1 | 6/2009 | Romano et al. |
| 2010/0040838 | A1 | 2/2010 | Abdallah et al. |
| 2010/0270652 | A1 | 10/2010 | Kim et al. |
| 2011/0195576 | A1 | 8/2011 | Ko et al. |

FOREIGN PATENT DOCUMENTS

| JP | 2010-96896 | 4/2010 |
| KR | 20000037885 | 7/2000 |

OTHER PUBLICATIONS

European Search Report, European Patent Application No. 12150658.8 dated May 7, 2012.

*Primary Examiner* — Stephen Rosasco
(74) *Attorney, Agent, or Firm* — McDonnell Boehnen Hulbert & Berghoff LLP

(57) ABSTRACT

A method and system are described for performing extreme ultraviolet photolithographic processing. The method comprises obtaining a substrate comprising a hard mask and a patterned layer of extreme ultraviolet (EUV) photoresist formed above the hard mask, encapsulating the patterned layer of EUV photoresist by forming an encapsulating layer being one of a silicon-oxide, silicon-nitride, silicon-oxynitride, germanium-oxide, germanium-nitride, germanium-oxynitride, silicongermanium-oxide, silicongermanium-nitride, silicongermanium-oxynitride layer on the photoresist and dry etching of the substrate for patterning the hard mask. The encapsulation layer thereby is formed at a temperature below the weakening temperature Tg of the EUV photoresist by using a first precursor being one of the group of silicon-tetrahalogenide, silicon tetrahydride, germanium-tetrahalogenide, germanium tetrahydride, silicongermanium-tetrahalogenide or silicongermanium tetrahydride precursor and an oxygen precursor.

10 Claims, 5 Drawing Sheets

(A)
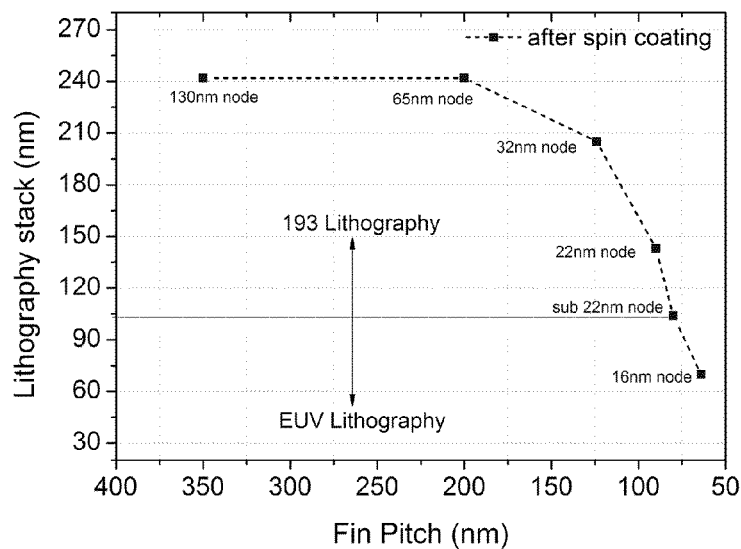
(B)
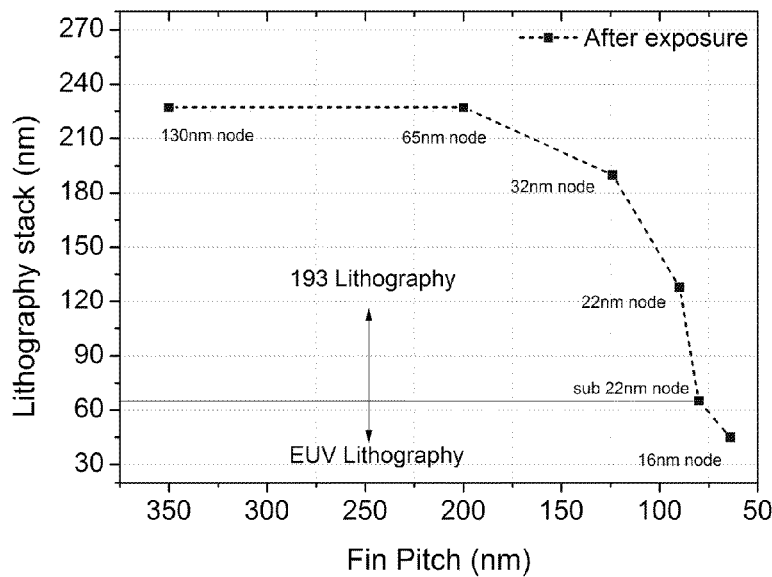
FIG. 1

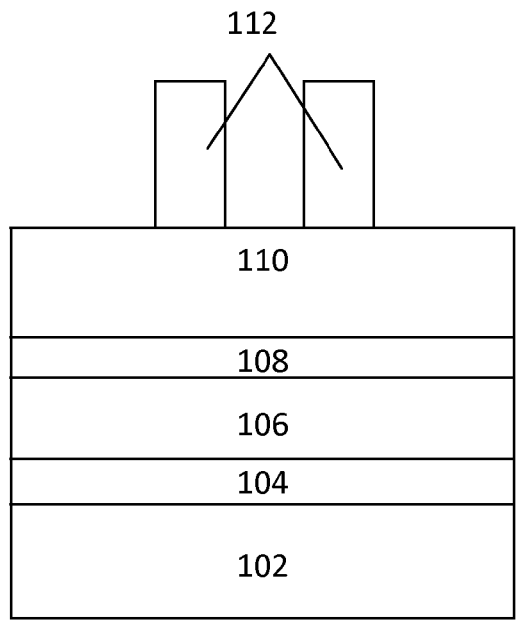
FIG. 2 – Prior Art
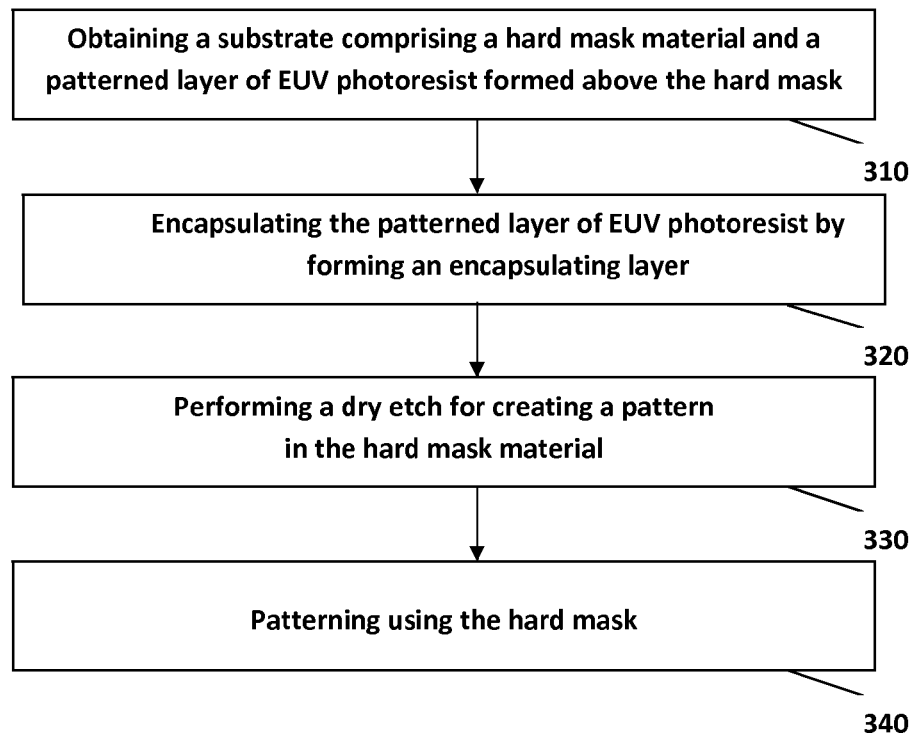
FIG. 3

EUV PHOTORESIST ENCAPSULATION

CROSS REFERENCE TO RELATED APPLICATIONS

Pursuant to the provisions of 35 U.S.C. §119(b), this application claims priority to EP11194789.1 filed Dec. 21, 2011, the entire contents of which are incorporated herein by reference. The present patent application also claims priority under 35 U.S.C. §119(b) to EP 12150658.8 filed Jan. 10, 2012, the entire contents of which are incorporated herein by reference.

FIELD

The present disclosure relates to the field of extreme ultraviolet lithography. More particularly, the present disclosure relates to methods and systems for protecting EUV compatible photoresist during selective etching of a mask pattern in a layer below the photoresist.

BACKGROUND

Optical lithography nowadays often uses wavelengths of 248 nm or 193 nm. With 193 nm immersion lithography integrated circuit (IC) manufacturing is possible down to the 45 nm node or even down to the 32 nm node. However, for printing in sub-32 nm half pitch node, 193 nm is probably not satisfactory due to theoretical limitations, unless double patterning is used. Instead of using wavelengths of 193 nm, a more advanced technology has been introduced, also referred to as extreme ultraviolet lithography (EUV lithography), which uses wavelengths of 10 nm to 14 nm, with as typical value 13.5 nm. This technique was previously also known as soft X-ray lithography more specifically using wavelengths in the range of 2 nm to 50 nm.

Over the past years a tremendous effort has been put on Extreme Ultraviolet lithography (EUVL) for printing lines with pitches below 60 nm. Optimization of EUV lithography has included optimization of mask, illumination techniques, treatments and photoresists used. The particular EUV Photo Resist (PR) that has been selected for EUV processing has different etch resistivity and thickness compared to a 193(i) photoresist (193 immersion photoresist), bringing new challenges for dry etching.

One drawback of EUV lithography is the photoresist height which is typically reduced after exposure down to about 50 nm. FIG. 1 shows the evolution of the lithography stack thickness after spin coating (nominal thickness) (A) and after exposure (B), whereby for larger pitches the results for 193 nm immersion lithography are shown and for smaller pitches the results for a typical EUV lithography process as currently used are shown. The thickness for the stack in 193 nm immersion lithography is determined by the thickness of the BARC (bottom anti-reflective coating) and the thickness of the photoresist, whereas for a EUV lithography the stack thickness is determined based on the thickness of the under layer (UL) and the thickness of the photoresist.

An example of a typical stack used in EUV lithographic processing is schematically illustrated in FIG. 2. The stack typically comprises a silicon on insulator (SOI) wafer with a buried oxide layer (BOX) 102, a crystalline silicon layer (C—Si) 104, a set of two hardmask layers 106, 108, an underlayer (UL) 110, and an EUV photoresist layer 112.

In FIG. 1, it can be observed that as the device pitch is scaled down, the photoresist budget—being the amount of photoresist thickness that is left for protecting the underlying layers during and after processing—is dramatically reduced.

The reduction of the photoresist height can amongst others also be caused by the application of a hydrogen H2 pre-plasma-treatment (PPT), which consumes the photoresist. Nevertheless, such a pre-plasma-treatment is interesting as it significantly improves the line width roughness (LWR) for the lithographic processed device and, therefore, preferably is applied.

Another cause of the reduction of the photoresist is the need for hard mask opening, e.g., obtained through dry etching. The ion bombardment and VUV photons used degrades the photoresist, and as a consequence thereof also degrades the line width roughness that is finally obtained.

Due to the drastic reduction of the photoresist height a too narrow process window for further etching steps typically is created. With the need for smaller device pitches, there is therefore a need for improving the photoresist etch resistivity, as for the smallest pitches of interest, the photoresist etch resistivity is too low to provide appropriate lithographic processing. Therefore, there is room for improving EUV lithographic processing, bearing in mind that currently the EUV photoresist height and the etch resistivity are so low when small pitches need to be processed.

SUMMARY

This disclosure describes methods and systems for applying a dry etching process on a dense pattern printed using extreme ultraviolet (EUV) lithography.

It is an advantage of embodiments according to the present disclosure that deterioration of the photoresist (PR) during the etching process for patterning the hard mask can be limited, reduced, or even avoided.

It is an advantage of embodiments according to the present disclosure that during EUV lithographic processing, the EUV photoresist can be protected during the dry etching of the hard mask and that therefore a low line width roughness (LWR) can be maintained.

It is an advantage of embodiments according to the present disclosure that encapsulation can be provided with a material stronger—i.e., more resistant to dry etching—than the photoresist, which provides a higher etching resistivity to the EUV photoresist and will provide a taller pattern, i.e., the encapsulation layer is thicker on top of the features than in between of the features.

It is an advantage of embodiments according to the present disclosure that methods and systems are provided allowing encapsulation of the EUV photoresist at low temperature, i.e., at temperatures substantially lower than the glass transition temperature $T_g$, being the temperature at which the mechanical stability of the photoresist starts to be jeopardized.

It is an advantage of embodiments according to the present disclosure that methods and systems are provided allowing encapsulation of the EUV photoresist using an in-situ method, such that it can be performed in the same setup as the dry etching process following the encapsulation. The latter reduces contamination and allows for easy processing. Not only the hard mask etching but also an optional pre-plasma-treatment can be performed in the same setup, i.e., in the same etching chamber.

The present disclosure relates to a method for performing extreme ultraviolet photolithographic processing, the method comprising, obtaining a substrate comprising a hard mask and an extreme ultraviolet (EUV) photoresist layer comprising photoresist protrusions formed above the hard mask, encapsulating the patterned layer of EUV photoresist by forming an encapsulating layer being one of a silicon-oxide, silicon-nitride, silicon-oxynitride, germanium-oxide, germanium-nitride, germanium-oxynitride, silicongermanium-oxide, silicongermanium-nitride or silicongermanium-oxynitride on the photoresist, whereby the encapsulating layer is formed at a temperature below the weakening temperature Tg of the EUV photoresist using a first precursor being one of the group of silicon-tetrahalogenide, silicon tetrahydride, germanium-tetrahalogenide, germanium tetrahydride, silicongermanium-tetrahalogenide or silicongermanium tetrahydride precursor and an oxygen precursor, and thereafter dry-etching the substrate for patterning the hard mask.

It is an advantage of embodiments according to the present disclosure that an encapsulating layer can be formed at low temperature, i.e., at temperature lower than the weakening temperature of the EUV photoresist, thus, allowing to substantially maintain its mechanical stability as deposited.

Encapsulating may be performed in the same setup as the dry-etching. It is an advantage of embodiments according to the present disclosure that processing can be performed in the same setup as the dry-etching, thus, reducing the complexity of the process.

By performing the encapsulating, an encapsulating layer may be formed having a thickness on top of the photoresist protrusions, being substantially larger than the thickness of the encapsulating layer at other positions of the photoresist layer.

Obtaining the substrate may comprise performing a hydrogen pre-plasma-treatment of the substrate.

Performing a hydrogen pre-plasma-treatment may comprise performing a hydrogen pre-plasma-treatment in the same chamber as used for the dry-etching.

Wherein encapsulating the patterned layer of EUV photoresist may comprise forming an encapsulating layer being a silicon-oxide layer.

Wherein forming an encapsulating layer using a first precursor being one of the group of silicon-tetrahalogenide, silicon tetrahydride, germanium-tetrahalogenide, germanium tetrahydride, silicongermanium-tetrahalogenide or silicongermanium tetrahydride precursor and an oxygen precursor may comprises performing a plasma process.

The dry-etching may comprise etching hard mask material at positions where no photoresist protrusions occur, while substantially maintaining hard mask material at positions where photoresist protrusions occur.

The present disclosure also relates to an intermediate structure for preparing a hard mask, the intermediate structure comprising at least one hard mask layer, an EUV photoresist resist layer comprising photoresist features and an encapsulation layer for encapsulating the EUV photoresist layer and its protrusions, wherein the thickness of the encapsulation layer at the top of the photoresist protrusions is larger, e.g., substantially larger, than the thickness of the encapsulation layer at other positions on the photoresist layer.

The present disclosure also relates to a semiconductor device comprising a patterned layer, wherein the patterned layer is obtained using EUV lithography using a method as described above.

The present disclosure also relates to the use of a method as described above for the manufacturing of a semiconductor device comprising a patterned layer.

Particular and preferred aspects of the disclosure are set out in the accompanying independent and dependent claims. Features from the dependent claims may be combined with features of the independent claims and with features of other dependent claims as appropriate and not merely as explicitly set out in the claims.

Embodiments of the present disclosure result in improved patterning systems and methods allowing better production of patterned components, structures, circuits and devices.

These and other aspects of the disclosure will be apparent from and elucidated with reference to the embodiment(s) described hereinafter.

BRIEF DESCRIPTION OF THE DRAWINGS

FIG. 1 illustrates the evolution of the lithography stack thickness after spin coating (nominal thickness) and after exposure as required for different pitches, illustrating the problem of photoresist layer thickness solved by embodiments of the present disclosure.

FIG. 2 illustrates an exemplary lithographic stack as can be used in EUV lithographic processing according to prior art.

FIG. 3 illustrates a method for assisting in lithographic processing including provision of an encapsulation layer of the EUV photoresist, according to an embodiment of the present disclosure.

Figure 4:
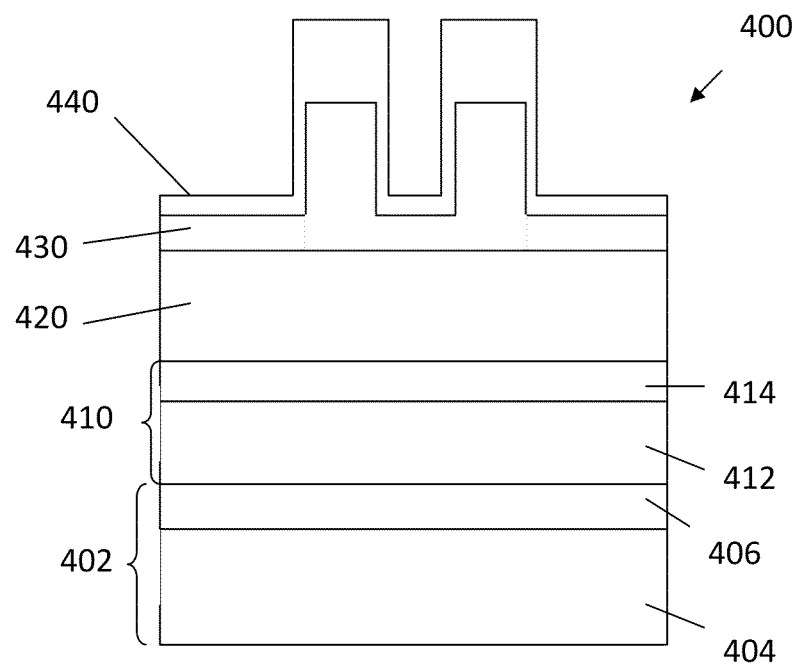
FIG. 4 illustrates a schematic representation of an intermediate structure for forming a hard mask, according to an embodiment of the present disclosure.

The drawings are only schematic and are non-limiting. In the drawings, the size of some of the elements may be exaggerated and not drawn on scale for illustrative purposes.

DETAILED DESCRIPTION OF ILLUSTRATIVE EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising," used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Where in embodiments according to the present disclosure reference is made to a siliconoxide like material or to an encapsulating layer, reference is made to a silicon based layer such as silicon-oxide, silicon-nitride, silicon-oxynitride, or/and a germanium based layer such as germanium-oxide, germanium-nitride, germanium-oxynitride or/and to a silicongermanium based layer such as silicongermanium-oxide, silicongermanium-nitride, silicongermanium-oxynitride. Some particular possibilities are silicon-oxide, silicon-nitride or silicon-oxynitride in any stoichiometric proportion between Silicon, Oxygen or Nitrogen ($Si_xO_y/Si_xN_y$). The ratio between Si precursor (e.g., $SiCl_4$) and $O_2$ or $N_2$ can be varied, thus resulting in a changed silicon-oxide/nitride stoichiometry.

Where in embodiments according to the present disclosure reference is made to the hard mask, reference is made to the material that is used as an etch mask. In one example of a hard mask whereby an SOI wafer is used, on top of the SOI wafers, two chemical vapor deposition (CVD) layers are used as follows from bottom to top: 40 nm of amorphous carbon layer (ACL) was used as bottom hard mask; 15 nm of silicon oxycarbide (SiOC) which was used as top hard mask. The top hard mask is a strong material, which provides a wide process window for patterning carbon based materials such as the bottom hard mask. The combination of these two hard mask layers typically can provide enough topography for patterning silicon features with a height of around 300 nm. Therefore, once PR pattern is transferred into the top hard mask, the PR thickness is irrelevant.

Where in embodiments according to the present disclosure reference is made to photoresist protrusions of a photoresist layer, reference may be made to photoresist features or patterns intended to cover a layer below the photoresist layer, so that this portion of the layer (i.e., the portion below the photoresist features or patterns), is not etched in a later step.

Where in embodiments according to the present disclosure reference is made to an encapsulation material, an encapsulation layer and/or encapsulating, reference is made to material and/or the act of covering an underlying layer, so as to protect it during at least part of subsequent processing, i.e., so as to prevent a direct effect on the underlying layer during at least part of subsequent processing.

In a first aspect, the present disclosure relates to a method for performing extreme ultraviolet photolithographic processing or assisting therein. The method may also be referred to as a method for making a hard mask or assisting therein. Reference is made to extreme ultraviolet photolithographic processing when radiation is used having a wavelength within the range 2 nm to 50 nm, more advantageously radiation having a wavelength within the range 10 nm to 14 nm. The method may cover the full lithographic process or may only cover the formation of a patterned hard mask and, thus, be a part of the full lithographic process.

According to embodiments of the present disclosure, the method comprises obtaining a substrate comprising hard mask material and a patterned layer of extreme ultraviolet (EUV) photoresist formed above the hard mask material. The method also comprises encapsulating the patterned layer of EUV photoresist by forming an encapsulating layer being for example one of a silicon-oxide, silicon-nitride, silicon-oxynitride, germanium-oxide, germanium-nitride, germanium-oxynitride, silicongermanium-oxide, silicongermanium-nitride or silicongermanium-oxynitride on the photoresist and dry etching of the substrate for patterning the hard mask. The encapsulation layer thereby is formed at a temperature below the weakening temperature Tg of the EUV photoresist by using a first precursor being one of the group of silicon-tetrahalogenide, silicon tetrahydride, germanium-tetrahalogenide, germanium tetrahydride, silicongermanium-tetrahalogenide or silicongermanium tetrahydride precursor and an oxygen precursor.

By way of illustration, embodiments of the present disclosure not being limited thereto, standard and optional steps according to embodiments of the present disclosure will be further discussed with reference to an exemplary method 300 for assisting in lithographic processing, as shown in FIG. 3.

The exemplary method 300 comprises obtaining 310 a substrate comprising hard mask material and a patterned layer of extreme ultraviolet (EUV) photoresist formed above the hard mask material. The different materials typically may be provided on a substrate. The term "substrate" may include any underlying material or materials that may be used, or upon which a device may be formed. In other alternative embodiments, this "substrate" may include a semiconductor substrate such as, e.g., silicon, a gallium arsenide (GaAs), a gallium arsenide phosphide (GaAsP), an indium phosphide (InP), a germanium (Ge), or a silicon germanium (SiGe) substrate. The "substrate" may include, for example, an insulating layer such as a $SiO_2$ or a $Si_3N_4$ layer in addition to a semiconductor substrate portion. Thus, the term substrate also includes silicon-on-glass and silicon-on-sapphire substrates. The term "substrate" is, thus, used to define generally the elements for layers that underlie a layer or portions of interest. In one particular embodiment, the substrate is a silicon-on-insulator wafer with a buried oxide layer and a crystalline silicon layer on top thereof.

The hard mask material may comprise one or more layers of material, which after patterning will form the hard mask. Hard mask materials that may be used may be multilayer structures, and may be made for example of carbon based material, silicon oxides, silicon nitrides, tungsten, titanium, titaniumoxide, titanium-nitride, and so on.

Some examples of EUV photoresist that may be used are molecular glass photoresists, chemically amplified type resists, etc. Some examples of EUV photoresists that may be used are SEVR-59 and SEVR-140, embodiments of the present disclosure not being limited thereto. The resist may be a positive-type or negative-type resist. Typical steps for patterning the photoresist layer may comprise providing a coating of resist material, e.g., by spincoating, soft baking, exposing, post-exposure baking, developing and hard baking. Other steps for patterning the photoresist material also may be included. Obtaining the stack of layers as indicated in the present step may comprise obtaining such a stack ready made or may comprise performing part or all of the deposition and patterning process indicated above.

Below the EUV photoresist, an underlayer (UL) may be provided. The UL may for example be a carbon-based material that is not photo sensitive to the EUV lithography. One way of deposition of this layer is by spin-coating. The underlayer, i.e., the layer below the photoresist, may for example be provided for sticking purposes of the photoresist layer.

The step of obtaining 310 a substrate also may comprise performing a pre-plasma-treatment, e.g., a hydrogen $H_2$ pre-plasma-treatment. Such a hydrogen pre-plasma-treatment typically can be performed in a dry-etching chamber, also used for the later processing. The pre-plasma-treatment is intended to improve the line width roughness of the system.

By way of illustration, embodiments of the present disclosure not being limited thereto, an example of an intermediate structure may comprise a substrate 402, e.g., comprising different sublayers 404 and 406, a hardmask 410, e.g., comprising different layers 412 and 414, an underlayer 420, and an EUV photoresist layer 430 as depicted in FIG. 4. According to embodiments of the present disclosure, an intermediate structure also comprises an encapsulation layer, whereby the encapsulation layer is thicker at the top of the resist features and lower between the resist features. This encapsulation layer 440 is also shown in FIG. 4. The step of obtaining the encapsulation layer 440 is described hereafter.

Returning to FIG. 3, the method further comprises encapsulating 320 the patterned layer of EUV photoresist by forming an encapsulating layer being one of a silicon-oxide, silicon-nitride, silicon-oxynitride, germanium-oxide, germanium-nitride, germanium-oxynitride, silicongermanium-oxide, silicongermanium-nitride or silicongermanium-oxynitride layer on the photoresist. This layer typically has a hardness or etch resistance that is substantially larger than the resistance to etching of the underlying photoresist. The relative hardness of the uncovered photoresist—reference is made to relative hardness of the photoresist in the present example being photoresist on silicon due to the fact that the substrate hardness also plays a role as the photoresist is too thin to exclude the effect of substrate hardness is between 0.4 and 0.6 GPa, e.g., about 0.45 GPa. Photoresist covered with an encapsulating layer is about 75% harder than the uncovered photoresist.

The encapsulation layer may be deposited using a method inducing an anisotropic thickness. The thickness of the deposited encapsulation layer advantageously is higher at the top of the photoresist features than in between these features. According to embodiments of the present disclosure, the thickness may be at least 10%, advantageously at least 25%, more advantageously at least 50%, still more advantageously at least 75%, even more advantageously at least 100% larger at the top of the photoresist features. It is an advantage of embodiments according to the present disclosure that the encapsulating step using the above described method results in a nanoloading effect, i.e., it results in the fact that the deposited encapsulation layer at the top of the photoresist layers is larger than in between the photoresist layers. This allows for opening the dry etching process window in later patterning steps. The deposited thickness may for example be between 3 nm and 20 nm, e.g., between 4 nm and 10 nm, e.g., between 5 nm and 7 nm.

An above described encapsulation layer is obtained using a deposition technique using a first precursor being one of the group of silicon-tetrahalogenide, silicon tetrahydride, germanium-tetrahalogenide, germanium tetrahydride, silicongermanium-tetrahalogenide or silicongermanium tetrahydride precursor and a second oxygen precursor. Furthermore, the deposition technique has the advantage of allowing formation of the encapsulation layer at a temperature below the weakening temperature Tg of the EUV photoresist. In some embodiments, the temperature may be kept below 90° C., e.g. below 75° C.

It is an advantage of embodiments according to the present disclosure that both the line width roughness can be maintained during, e.g., etching of an underlayer, and that the photoresist profile can be maintained or is only influenced in a minor way during etching of the hard mask.

The method also comprises performing a dry etching 330 of the substrate for patterning the hard mask. In some embodiments, advantageously, such a dry etching can be performed in the same processing room, as the deposition of the encapsulation layer. The latter can assist in reducing contamination and/or can result in an efficient lithographic processing. The dry etching step 330 may comprise opening the under layer, i.e., transferring the photoresist pattern in the underlayer and opening the hard mask layers, i.e., transferring the photoresist pattern in the hard mask layers.

The method also may comprise patterning 340 a layer of interest below the hard mask layer, using the patterned hard mask layer. The particular etches that can be used, depend on the type of material that is to be patterned. It is an advantage of at least some embodiments of the present disclosure that also this patterning can be performed in the same etching chamber as used in the steps described above. Further steps, typical to lithographic processing, such as for example removal of the hard mask, also may be performed.

It is an advantage of embodiments according to the present disclosure that the encapsulation provides a protection of the photoresist against premature degradation during the patterning of the under layer and the hard mask.

In one aspect, the present disclosure also relates to an intermediate structure for preparing a hard mask, the intermediate structure comprising at least one hard mask layer, an EUV photoresist resist layer comprising photoresist features and an encapsulation layer for encapsulating photoresist protrusions, wherein the thickness of the encapsulation layer at the top of the photoresist protrusions is larger, e.g., substantially larger, than the thickness of the encapsulation layer at other positions on the photoresist layer. Such a layer may further have one, more or all features as described for the intermediate layer obtained with the above described method or as induced by one or more method steps of the above described method.

In another aspect, the present disclosure also relates to a semiconductor device comprising a patterned layer obtained using a method according to the first aspect, and/or to the use of a method according to the first aspect for manufacturing a semiconductor device comprising a patterned layer.

By way of illustration, embodiments of the present disclosure not being limited thereto, experimental results will further be discussed for illustrating features and advantages of at least some embodiments of the present disclosure.

The results discussed below relate to an example for patterning fins on a semiconductor on insulator material having a 32 nm lines/spacing, exposed using EUV lithography. The substrates were 300 nm silicon on insulator wafers. For EUV lithography, a lithographic system with a 13.4 nm EUV radiation source and a numerical aperture of 0.25 nm was used. Dry etching was performed in a Lam Research Kiyo 3X reactor, being a transformer-coupled plasma TCP™ reactor.

In the following description of the experiment, we will focus on a number of processing steps from the full patterning flow, i.e., these steps where the features and advantages of the methods and systems according to embodiments of the present disclosure are playing their most important role. Typically, at one point during the lithographic processing, a patterned EUV photoresist layer is obtained, and the corresponding pattern needs to be transferred in the hard mask, in the present experiment being a silicon-on-insulator material. Such a transfer can be done using a dry etching process. It is particularly in the transfer process of the pattern that features and advantages of embodiments of the present disclosure play their role. Consequently, the numerous other processing steps that typically are applied during lithographic processing will not be described here, but are known to the person skilled in the art.

In the particular experiment, a patterned EUV photoresist layer on top of a stack of an under layer UL, two hard mask layers being a siliconoxidecarbide layer and an amorphous carbon layer ACL layer and an underlying substrate comprising silicon on a further substrate is obtained with the intention of transferring the pattern present in the EUV photoresist layer to the C-Si layer. The substrate was a 300 mm Silicon on Insulator (SOI) wafer with 145 nm buried $SiO_2$ (BOX) and 60, 40 or 30 nm thick (100) crystalline Silicon (c-Si). The structures were patterned in the (110) direction using the stack described below. The ACL layer was obtained by chemical vapor deposition on top of the SOI wafer. The obtained layer was 40 nm thick. The siliconoxidecarbide layer was also obtained through chemical vapor deposition (on top of the ACL layer) and a thickness of 15 nm was deposited. The lithographic stack (deposited on top of the siliconoxidecarbide layer) consisted of 20 nm of under layer (UL) and 60 nm of nominal thickness of photoresist. The lithographic processing of the EUV photoresist was performed on an Alfa Demo Tool (ADT) from ASML, hooked up to an ACT12 (TEL).

The deposition of the silicon oxide like encapsulation layer was carried out in a Lam Research Kiyo C 2300 reactor. This is a transformer-coupled plasma (TCP™) reactor that allows a separate control of plasma power and substrate bias. The plasma conditions were a base pressure of 8 mtorr, a power of 300 W and voltage of 0V and a transformer coupled capacitive tuning parameter of 0.5. Furthermore, a center position was used and 5 units of $SiCl_4$, 20 units of $O_2$ were used for forming the silicon oxide like layer. The temperature of the electrostatic chuck was 50° C.

XPS analyses were performed on different substrates in order to determine the composition of the encapsulation layer deposited on top of the EUV PR. According to these analyses, the encapsulation layer composition was $SiO_{1.7}$. In other words, a siliconoxide-like layer was formed.

Figure 5:
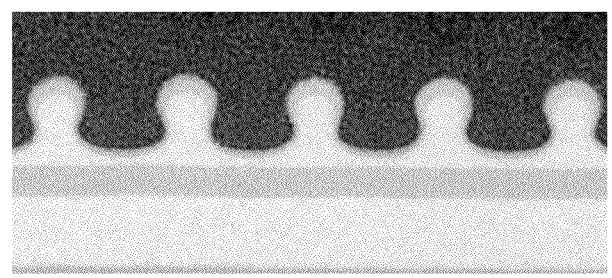
FIG. 5 illustrates a TEM cross-section picture illustrating an encapsulation layer provided using a deposition technique performed in the etching chamber, according to an embodiment of the present disclosure.

Analysis of the deposited layer was also performed using transmission electron microscopy. TEM cross-sections are shown in FIG. 5, illustrating on the one hand the core of the features being made of the EUV photoresist material, but also illustrating the layer surrounding the core, being the $SiO_2$ like layer deposited in the etching chamber. It can be seen that the deposited layer is indeed thicker at the top of the photoresist features, than in between the features, resulting in the advantageous opening of the dry etching process window as described above.

Figure 6:
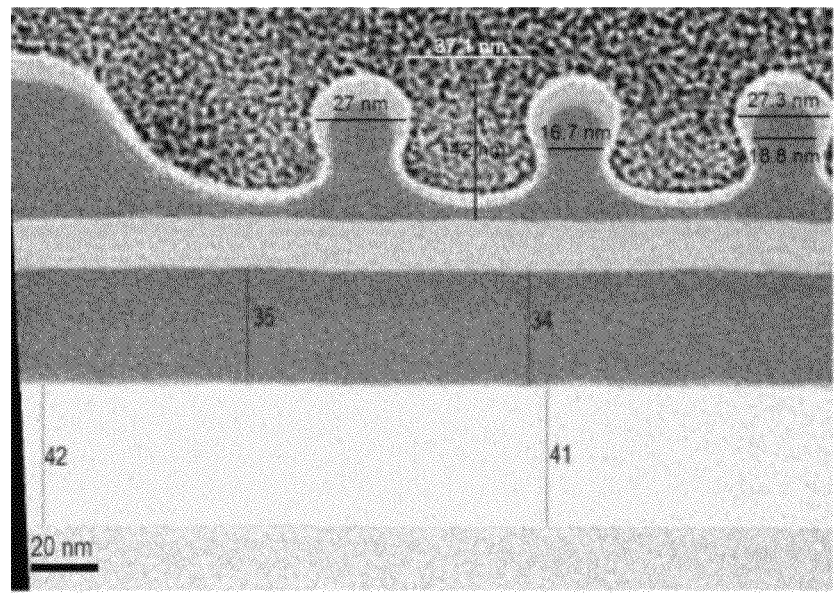
FIG. 6 illustrates another example of a detailed TEM cross section picture of the encapsulation layer on top of the EUV photoresist, according to an embodiment of the present disclosure.

FIG. 6 illustrates a high definition transmission electron microscopy picture of the encapsulation layer on the EUV photoresist. In the current example, the encapsulation layer increases the pattern height (i.e., provides encapsulation which is thicker on top of the features than in between the features). At the top, the encapsulation layer is 7 nm thick, whereas this is substantially less in between the features. In the present example, the encapsulation layer between the features is about 2 to 3 nm thick. This increase in feature height provides more process window to further etching steps.

In order to further illustrate the advantageous effects of the use of an encapsulation layer, the effect on pattern degradation, photoresist degradation and line width roughness degradation was monitored for different steps in the etching process.

In a first experiment, a structure as obtained above was used, whereby first a pre-plasma-treatment was performed, i.e., a hydrogen $H_2$ pre-plasma-treatment during 25 seconds, on the structure with the photoresist, then a photoresist encapsulating layer was applied, using the above described deposition conditions during a 15 seconds deposition step, and then the underlayer was opened, using a sulfurhexafluoride $SF_6$ dry etch during 7 seconds. Comparison was made to the situation where no encapsulating layer was used. It could be noticed that the improved line width roughness, obtained due to the hydrogen $H_2$ pre-plasma-treatment, was maintained after the provision of the encapsulation layer and after the under layer etch.

Figure 7:
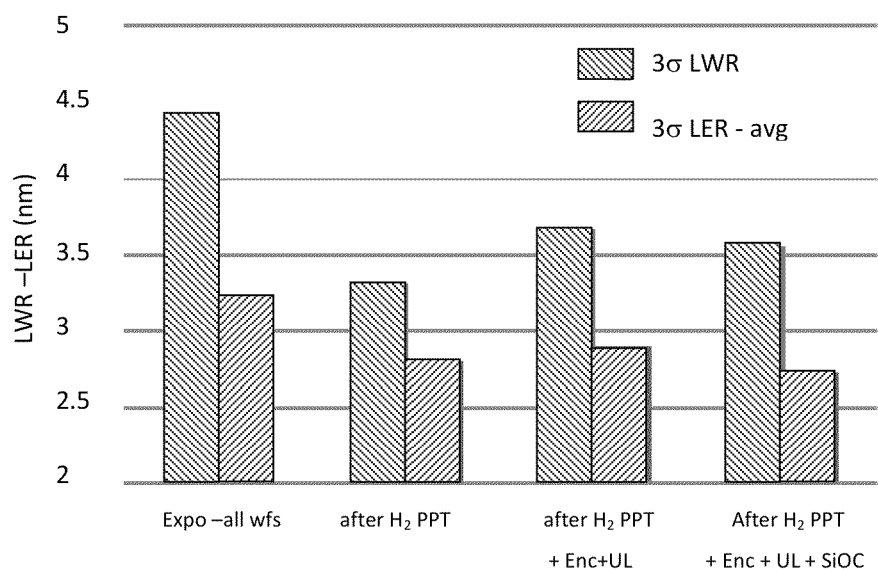
FIG. 7 illustrates the line width roughness and line edge roughness during different steps of the deposition and etching process when using an encapsulation layer according to an embodiment of the present disclosure.
Figure 8:
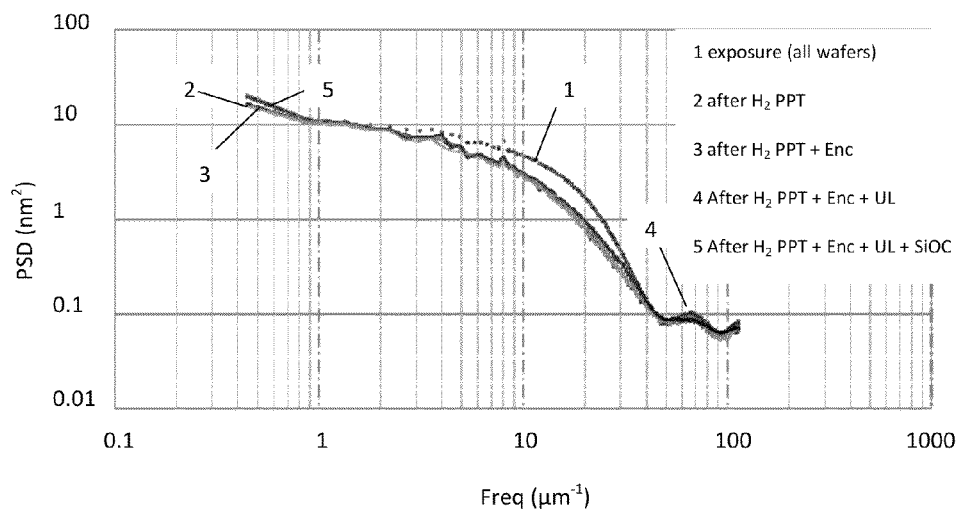
FIG. 8 illustrates the power spectral density for the line width roughness during different steps of the deposition and etching process when using an encapsulation layer according to an embodiment of the present disclosure.

The latter is illustrated in FIG. 7 and FIG. 8, illustrating the line width roughness and the line edge roughness (in nm) respectively the power spectral density of the line width roughness for different moments in time. FIG. 7 illustrates the line width roughness (LWR) and the line edge roughness (LER) after photoresist exposure, after the pre-plasma-treatment, and after the etching of the underlayer. It can be seen that after the etching of the underlayer, both the line width roughness and the line edge roughness still are substantially better than before the pre-plasma-treatment. Similarly, the improvement induced by the hydrogen pre-plasma-treatment, visible by a shift of the power spectral density in FIG. 8, is maintained after the encapsulation process and after the etching of the underlayer.

Figure 9:
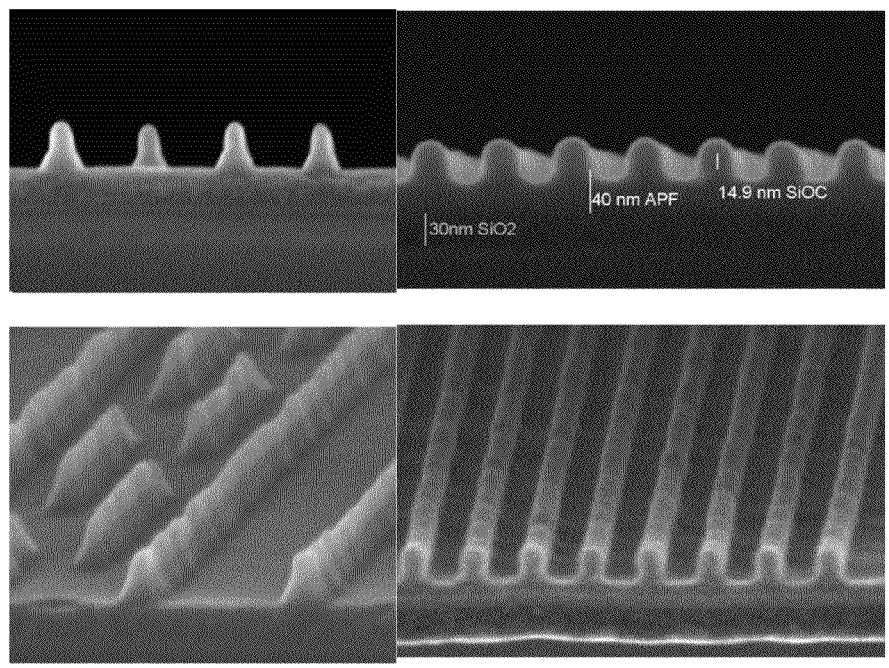
FIG. 9 illustrates a comparison of the photoresist profile after etching of the hard mask without encapsulation layer (left hand side) and with encapsulation layer (right hand side), illustrating advantages of embodiments according to the present disclosure.

In a second experiment, a structure as obtained above was used, whereby the same etching steps as indicated above are performed, but whereby additionally the siliconoxidecarbide layer is opened by etching using a difluoromethane $CH_2F_2$/sulfurhexafluoride $SF_6$ etch. FIG. 9 illustrates a comparison of the structure after this etching step with and without encapsulating layer. On the left hand side, a cross-section scanning electron microscope image and an elevated SEM image is shown for the situation whereby no encapsulation layer was present, whereas on the right hand side, a cross-section scanning electron microscope image and an elevated SEM image is shown for the situation whereby an encapsulation layer was present. It can be seen that there is a better selectivity in etch and a better profile control when the encapsulation layer is used. The latter also can be derived from FIG. 7 and FIG. 8, illustrating also the line width roughness and the line edge roughness (in nm) respectively the power spectral density of the line width roughness after the siliconoxidecarbide layer etching. It can again be seen that the improved line width roughness and line edge roughness is maintained even after the siliconoxidecarbide layer etching.

The above experiments illustrate that the use of an encapsulation layer preserves the photoresist profile and correspondingly therewith the line width roughness during etching of the hard mask, thus, illustrating advantages of embodiments according to the present disclosure.

The invention claimed is:

1. A method for performing extreme ultraviolet photolithographic processing, the method comprising:
   obtaining a substrate comprising a hard mask and an extreme ultraviolet (EUV) photoresist layer comprising photoresist protrusions formed above the hard mask;
   encapsulating the EUV photoresist by forming an encapsulating layer being one of a silicon-oxide, silicon-nitride, silicon-oxynitride, germanium-oxide, germanium-nitride, germanium-oxynitride, silicongermanium-oxide, silicongermanium-nitride, or silicongermanium-oxynitride layer on the photoresist, wherein the encapsulating layer is formed at a temperature below the weakening temperature (Tg) of the EUV photoresist using a first precursor being one of a silicon-tetrahalogenide, silicon tetrahydride, germanium-tetrahalogenide, germanium tetrahydride, silicongermanium-tetrahalogenide, or silicongermanium tetrahydride precursor and a second oxygen precursor; and
   dry-etching the substrate for patterning the hard mask.

2. A method according to claim 1, wherein encapsulating is performed in a same chamber as the dry-etching.

3. A method according to claim 1, wherein the encapsulating layer is formed having a thickness on top of the photoresist protrusions that is larger than a thickness of the encapsulating layer at other positions of the photoresist layer.

4. A method according to claim 1, wherein obtaining the substrate comprises performing a hydrogen pre-plasma-treatment of the substrate.

5. A method according to claim 4, wherein performing a hydrogen pre-plasma-treatment comprises performing a hydrogen pre-plasma-treatment in a same chamber as used for the dry-etching.

6. A method according to claim 1, wherein the encapsulating layer is a silicon-oxide layer.

7. A method according to claim 1, wherein forming the encapsulating layer using a first precursor being one of a silicon-tetrahalogenide, silicon tetrahydride, germanium-tetrahalogenide, germanium tetrahydride, silicongermanium-tetrahalogenide, or silicongermanium tetrahydride precursor and a second oxygen precursor comprises performing a plasma process.

8. A method according to claim 1, wherein the dry-etching comprises etching hard mask material at positions where no photoresist protrusions occur, while maintaining hard mask material at positions where photoresist protrusions occur.

9. A method according to claim 1, further comprising obtaining a patterned layer for a semiconductor device.

10. An intermediate structure for preparing a hard mask, the intermediate structure comprising:
    at least one hard mask layer;
    an extreme ultraviolet (EUV) photoresist resist layer comprising photoresist protrusions; and
    an encapsulation layer for encapsulating the EUV photoresist layer and protrusions, wherein a thickness of the encapsulation layer at a top of the photoresist protrusions is larger than a thickness of the encapsulation layer at other positions on the photoresist layer.

* * * * *